United States Patent
Rannestad (10) Patent No.: US 10,969,440 B2
(45) Date of Patent: Apr. 6, 2021

(54) MONITORING UNIT FOR A POWER CONVERTER

(71) Applicant: KK WIND SOLUTIONS A/S, Ikast (DK)

(72) Inventor: Bjørn Rannestad, Aalborg (DK)

(73) Assignee: KK WIND SOLUTIONS A/S, Ikast (DK)

( * ) Notice: Subject to any disclaimer, the term of this patent is extended or adjusted under 35 U.S.C. 154(b) by 440 days.

(21) Appl. No.: 15/522,318

(22) PCT Filed: Oct. 13, 2015

(86) PCT No.: PCT/DK2015/050313
§ 371 (c)(1),
(2) Date: Apr. 27, 2017

(87) PCT Pub. No.: WO2016/070881
PCT Pub. Date: May 12, 2016

(65) Prior Publication Data
US 2018/0292467 A1    Oct. 11, 2018

(30) Foreign Application Priority Data
Nov. 4, 2014    (DK) .................... PA 2014 00640

(51) Int. Cl.
*G01R 31/42*    (2006.01)
*F03D 17/00*    (2016.01)
*F03D 7/02*    (2006.01)

(52) U.S. Cl.
CPC ............ *G01R 31/42* (2013.01); *F03D 17/00* (2016.05); *F03D 7/0272* (2013.01); *F05B 2220/706* (2013.01); *F05B 2260/83* (2013.01); *F05B 2270/802* (2013.01); *Y02E 10/72* (2013.01)

(58) Field of Classification Search
None
See application file for complete search history.

(56) References Cited

U.S. PATENT DOCUMENTS 7,486,099 B1 *    2/2009  Manika ............... G01R 31/42
                                                324/762.08
7,570,101 B1    8/2009  Short et al.
(Continued)

FOREIGN PATENT DOCUMENTS

| CN | 102062051 A | 5/2011 |
| CN | 103392067 A | 11/2013 |
| EP | 2 690 785 A2 | 1/2014 |

OTHER PUBLICATIONS

Danish Patent and Trademark Office Search Report issued in Application No. PA 2014 00640 dated Jun. 4, 2015.
(Continued)

*Primary Examiner* — Nasima Monsur
(74) *Attorney, Agent, or Firm* — Pearne & Gordon LLP (57) ABSTRACT

The invention relates to a monitoring unit configured for monitoring a power converter of a wind turbine, the monitoring unit comprising: electric connection means configured for connecting the monitoring unit to one or more electric converter components, a cold area comprising a data communication interface, and one or more hot areas dedicated to obtain measurements from the one or more electric converter components.

30 Claims, 3 Drawing Sheets

(56) References Cited

U.S. PATENT DOCUMENTS

| | | | |
|---|---|---|---|
| 8,120,885 B2 * | 2/2012 | Klodowski | H02J 3/386 361/91.5 |
| 2002/0029097 A1 | 3/2002 | Pionzio, Jr. et al. | |
| 2005/0281065 A1 | 12/2005 | Nojima | |
| 2007/0024059 A1 * | 2/2007 | D'Atre | F03D 7/0272 290/44 |
| 2010/0133831 A1 | 6/2010 | Scholte-Wassink et al. | |
| 2011/0020122 A1 | 1/2011 | Parthasarathy et al. | |
| 2011/0204631 A1 | 8/2011 | Minami et al. | |
| 2011/0249368 A1 | 10/2011 | Andersen | |
| 2012/0248864 A1 | 10/2012 | Ioannidis et al. | |
| 2013/0184884 A1 | 7/2013 | More et al. | |
| 2013/0221669 A1 | 8/2013 | Yasugi | |
| 2014/0112032 A1 * | 4/2014 | Parkhou | G01R 31/42 363/37 |
| 2014/0218826 A1 | 8/2014 | Majarov et al. | |

OTHER PUBLICATIONS

Danish Patent and Trademark Office Search Report issued in Application No. PA 2014 00640 dated Dec. 8, 2015.
International Search Report issued in Patent Application No. PCT/DK2015/050313 dated Mar. 17, 2016.
Written Opinion issued in Patent Application No. PCT/DK2015/050313 dated Mar. 17, 2016.
Chinese Office action issued in Chinese Patent Application No. 2015800682319 dated May 14, 2019.

\* cited by examiner

MONITORING UNIT FOR A POWER CONVERTER

FIELD OF THE INVENTION

The invention relates to a monitoring unit and a method for monitoring electric components of a power converter for a wind turbine.

BACKGROUND OF THE INVENTION

The converter is one of the most expensive parts of the electric components of a modern wind turbine. At the same time, in relation to availability of the wind turbine, the converter is a vulnerable part. Therefore, it is important to be able to solve problems with the converter as fast as possible.

The prior art holds examples of how to control converters both to prevent faults from occurring and to operate safe in case of a fault. One example is US2007/0024059 disclosing how to control power flow through a conversion component of a wind turbine by switching devices hereof according to different modes dependent on monitoring operation condition of the conversion component.

Another example is found in US2005/0281065 disclosing a fault handling system for short circuit recovery an inverter bridge. Three branches of switches $S_1$-$S_4$, $S_{11}$-$S_{14}$, $S_{21}$-$S_{24}$ are disclosed. Each individual of these switches is controlled by a controller via a driver card dedicated to monitor and control one single switch. Separate transducers are able to obtain measurements of output current of the inverter bridge and separately communicate these measurements to the controller.

BRIEF DESCRIPTION OF THE INVENTION

The invention provides a monitoring unit and a method of monitoring components of a converter for a wind turbine in order to facilitate reliable data for use e.g. in root cause analysis and health determination of the power converter.

It is an object of the invention to provide a monitoring unit configured for monitoring a power converter of a wind turbine, the monitoring unit comprising electric connection means configured for connecting the monitoring unit to one or more electric converter components, a cold area comprising a data communication interface, and one or more hot areas dedicated to obtain measurements from the one or more electric converter components.

According to an advantageous embodiment of the invention the measurements of the converter are made when the converter is active i.e. when the converter converts power generated from the wind turbine generator (also sometimes referred to as power production mode).

The connection means may be implemented as wires which at one end is mounted at the monitoring unit preferably directly at a hot area and at the other end is connected the converter component preferably to terminals hereof which need to be monitored. Alternatively the connection means may be implemented as pins of a connector, a plug, wire, etc. The physical design of the connection means is preferably depending on the converter to be monitored.

By the term "cold area" should be understood an area which are safe to touch by hand i.e. protected against electrical shock. The cold area is servicing the monitoring unit including the hot areas. Servicing may include facilitating power to power consuming elements of the monitoring unit, facilitating communication between elements of the monitoring units and between the monitoring unit and its surroundings such as transmitting data over a data communication network, data processing, etc.

By the term "hot area" should be understood separate areas of the monitoring unit which are performing measurements of the converter components. Such areas may not be protected against electric shock and may have the electric potential of the converter component which is measured.

In an embodiment of the invention the monitoring unit is temporary connected to the power converter. Temporary or releasable connection of the monitoring unit is advantageous in the case where a converter needs to be monitored i.e. due to suspicion of an error, performance monitoring, etc. By connecting the monitoring unit data of periodic errors may be retrieved which otherwise would be missed as well as predetermined fault values may be monitored. Afterwards it may be removed and connected to another converter.

Furthermore it is advantageous if the monitoring unit is a standalone device which is preferably self-supplying with electric energy. Standalone should preferably indicate that the monitoring unit is self-supplied and thereby a floating potential in the monitoring unit is achieved in relation to the ground potential. This is advantageous in that galvanic separation of the monitoring unit reduces or eliminates problems in relation to coupling of currents from one circuit to another (which might disturb e.g. gate drivers of the switches), capacitance, etc.

In addition a standalone monitoring unit is advantage in that when monitoring of a converter in one wind turbine is finished, the monitoring unit could be used to monitor a converter in another wind turbine. The monitoring unit may be self-supplying e.g. by including a battery In an embodiment of the invention the cold area is galvanic isolated from each of the one or more hot areas. The galvanic isolation of the cold and hot areas is important to secure that e.g. the electric circuits of the hot areas which are not protected against electric shock and is measuring high currents and voltages are not damaging elements such as electric circuits of the cold area.

Since the hot and cold areas are galvanic isolated communication between the hot and cold areas may be performed e.g. by means of an optic fiber. In this way measurements from the hot areas can be communicated to the cold area and it becomes possible to process the measurement data in the monitoring unit and further it becomes possible to communicate the raw measured data or processed data to and from the monitoring unit.

As an alternative to optic communication wireless communication e.g. in the form of radio communication, pulse transformers, etc. might carry to measured data from a hot area to a cold area.

It should be mentioned that when using the term galvanic separation it should be understood or implemented as no electric connectors or very high impedance (preferably in the Mega Ohm size such as 1M Ohm or even 10M Ohm) between hot and cold area.

In an embodiment of the invention the one or more hot areas is in a first enclosure and the cold area is in a separate second enclosure. This is advantageous in that the cold area enclosure might be less exposed to noise disturbing the data processing and communication because it is possible to locate it in a remote location protected from e.g. electric noise.

Further the separation of hot and cold areas in different enclosures may be advantage in that it reduces or removes some safety issues and in relation to implementation of the monitoring unit separation in two separate enclosures may also be advantageous.

In an embodiment of the invention the one or more hot areas and the cold area is located in the same enclosure. Preferably the hot and cold areas are also at the same printed circuit board in this situation, but separation is also possible.

In an embodiment of the invention the hot area of the monitoring unit is self-supplied with power from the measuring points of the converter components. This is advantageous in that no power supply to the hot area from the cold area is necessary which ease creation of the galvanic separation of the hot and cold area. Further this will support the stand-alone version of the monitoring unit.

In an embodiment of the invention the hot area comprises at least a measuring circuit and means for galvanic separation of the hot area and the cold area.

In an embodiment of the invention the means for galvanic separation is an impedance of at least 1 Mega Ohm. This is advantageous in that the fewer components are located in the electric noisy enclosure of the hot area.

In an embodiment of the invention the hot area further comprises at least one of the list comprising: operational amplifier, analog-to-digital converter, data communication interface and data processor. By including a data processor as part of the hot area may reduce the amount of data to be transmitted between the hot and cold areas in that e.g. raw measurements may be processed and therefore only a few data representing the raw measurements may be communicated to the cold area.

In an embodiment of the invention the one or more converter components are selected from the list comprising: semiconductor switch, capacitors (DC or AC), busbar, inductances, filters, electrolytes and diodes. Hence both active and passive converter components may be monitored from the monitoring unit.

In an embodiment of the invention the connection means is configured for electric connecting the monitoring unit to the output power terminals of the inverter. The monitoring unit is thereby connected to the phase current i.e. the output of the power modules from which at least switch voltage can be measured.

Alternatively the connection means is connecting the monitoring unit to the gate drive of the switches or the terminals of the switches or diodes. Further the monitoring unit may be connected to relevant measuring points in the electric or thermic system of the converter facilitating desired measurements including baseplate of a semiconductor switch, cooling system of the inverter, etc. It should be mentioned that e.g. current may also be measured by know magnetic coupling means and that temperature measurements also does not necessarily require electric connection between monitoring unit and measuring object.

By semiconductor switch is preferably understood an IGBT switch but could also be a MOSFET, GTO, IGCT, thyristor, a silicon carbide switch, etc.

In an embodiment of the invention the electric connection means comprise a first part and a second part wherein the first part is attached to the monitoring unit and the second part is removably attached to the first part. It is very advantageous to be able to change the second part of the connection means in that this facilitates quick adaption of the monitoring unit to any kind of converter.

The first part is preferably attached in permanent manner e.g. to a printed circuit board constituting a hot area of the monitoring unit. The first part may be part of the printed circuit board such as a terminal or be extended to a kind of socket in a cover covering the printed circuit board or the monitoring unit as such.

In an embodiment of the invention the measurements obtained from the one or more converter components may give information of one or more of state for health of the converter, operation condition, parameters, optimize control of the converter (or converter component) and timing. Preferably timing should be understood as general timing issues such as timing of switching both single switching and interrelated timing between a plurality of switches, time stamping of events, as reference, etc.

The above includes at least time, temperatures, switch voltages and switch currents.

In an embodiment of the invention the collector emitter voltage (Vce) of the semiconductor switches is measured. This is advantageous in that changes in the collector emitter voltage can be used to estimate end of lifetime of the semiconductor switch, temperature of the semiconductor switch, load level of the semiconductor switch, etc. In addition the measurements may be used as reference for later root cause analysis, etc.

In an embodiment of the invention the current through the semiconductor switches is measured.

In an embodiment of the invention the monitoring unit further facilitates measuring voltage of the DC link. It is advantageous to be able to measure voltages relating to the individual components such as IGBT and capacitor and also the sum of such individual voltages/DC link voltage may be advantageous to obtain. The latter is especially advantages in relation to modular multilevel converter or other high voltage topologies.

In an embodiment of the invention the monitoring unit is configured for remote configuration. This is advantageous in that after the monitoring unit is installed the definition of what should be monitored could be made. This of course requires a data connection to the monitoring unit preferably from a remote data processor typically a computer. Preferably the monitoring unit facilitates wireless data communication. Preferably the monitoring unit is connected to such computer via the wind turbine network and/or a public data communication network such as the Internet.

In an embodiment of the invention the configuration includes defining a batch job, wherein the batch job comprises predefined trigger criteria and predefined data to be acquired when the predefined trigger criteria is complied with. It is advantageous to create a batch job with predefined data to be acquired when one or more predefined trigger criteria's are complied with.

This facilitates that only the needed date for a needed period of time is stored leaving post analysis more effective in that only relevant data is captured.

The batch job could be made before the monitoring unit is installed at the converter or after and remote if the monitoring unit is accessible via a data communication network.

The batch job may also include rules relating to sample frequency of measurements, time data has to be captured, etc.

In an embodiment of the invention the measuring unit is configured for executing a self-calibration routine. The self-calibration routine is very advantageous in that measurements from the monitoring unit in this way become more valid.

In an embodiment of the invention the monitoring unit is physically attached to the converter by fastening means. Fastening means could be one or more hooks, clamps, clips, magnets, suction disks, etc. depending on type of converter measuring unit and converter to be measured.

Alternative the fastening means and the connection means are the same physical means hence by the attachment of the monitoring unit to the converter, converter panel, or the like measurements may be facilitated.

Moreover the invention relates to a method of monitoring one or more converter component with a monitoring unit 4 as described above, the method comprising the steps of configuring the monitoring unit to perform desired monitoring, making sure that there are no voltage across the converter, mounting the electric connection means to the one or more converter components, and release the converter for production. The configuration step (includes components or values to be measured) can be made at any time during the method of monitoring and the configuration could also include the default configuration of the monitoring unit from birth of the monitoring unit.

Making sure that no voltage is across the converter could be obtained by turning off power production of the wind turbine and/or putting the power converter in a non-conducting mode.

Releasing the converter for production could be obtained by turning on power production of the wind turbine and/or putting the power converter in a conducting mode.

The monitoring of converter components may be temporary.

In an embodiment of the invention the one or more converter components at least include a semiconductor switch.

Moreover the invention relates to the use of a measuring unit as described above for measuring switch voltage and/or switch current of a semiconductor switches.

FIGURES

A few exemplary embodiments of the invention will be described in more detail in the following with reference to the figures, of which

DETAILED DESCRIPTION OF THE INVENTION

Figure 1:
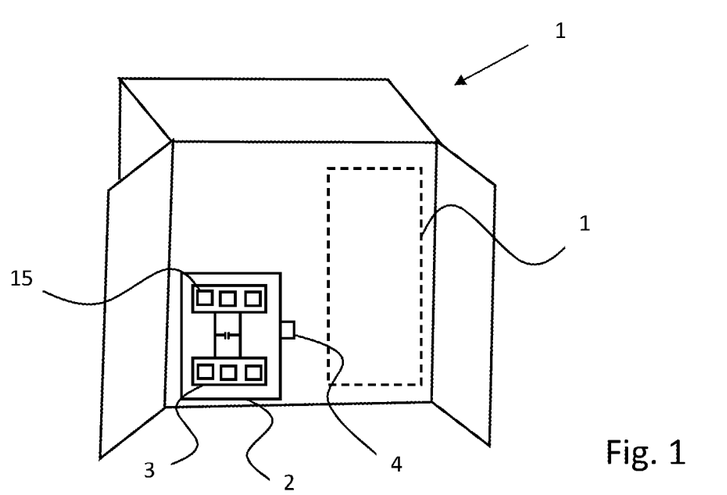
FIG. 1 illustrates a converter panel of a wind turbine.

FIG. 1 illustrates a panel 1 of a wind turbine protecting electric components from its surroundings. The illustrated panel comprise at least part of a converter 2 including one or more inverters 3. An inverter 3 should be understood as part of the converter 2 converting electric power generated by the wind turbine so that the power can be feed to a utility grid. Such converter 2 may comprise one or more inverters 3 each comprising one or more power modules 15 including one or more semiconductor switches 18.

The converter 2 may comprise a generator/machine side inverter and a grid side inverter. The generator side inverter and the grid side inverter are connected to each other by a DC-link.

The power module 15 is controlled so as to shape the power produced by the wind turbine to comply with predefined requirements e.g. in relation to the grid frequency, active and reactive currents, voltage etc. The semiconductor switches are typically Insulated Gate Bipolar Transistors (IGBTs) but other types of semiconductor switches could also be used (such as e.g. IGCT, Thyristors, GTO, Silicon Carbide switches, etc.). The semiconductor switches 18 may be grouped together in a power module 15 hence an inverter 3 may comprise one or more power modules 15.

It should be mentioned that the power modules 15 could be completely identical both in design, functionalities, data to be measured, processed, communicated, etc.

An embodiment of the invention where a power module 15 of an inverter 3 is controlled by the gate driver 16 will now be described. Preferably one gate driver 16 controls one semiconductor switch 18, but is not limited hereto.

Depending on the type of semiconductor switch 18 the voltages and currents may be referred to differently hence in this description the term "switch voltage" at least refers to the voltages: Vce for IGBT (collector-emitter), Vce for Bipolar Transistor, Vds for MOSFET (drain-source), Vak for Thyristor (anode-kathode), Vge/Vgate (gate voltage) (IGBT/MOSFET), Vbe (base voltage) (Bipolar Transistor), Vgk (gate kathode) (Thyristor), Vgate (Gate voltage of switch), etc.

In the same way the current through the semiconductor switches 18 may be referred to by the term "switch current" which at least refers to the currents: Ianode (Thyristor), Icollector (Bipolar Transistor), Ic (collector current), phase current (i.e. the output current from a power module 15 the sum of contributions from e.g. two diodes and two switches see FIG. 4), etc.

Preferably the monitoring unit 4 may be configured for measuring the above mentioned switch voltages and switch currents and in particular $V_{CE}$ but is not limited hereto.

With this said it should be noted that even though above only semiconductor switches 18 are mentioned measurements could be made related to all types of semiconductors also including diodes 19 which are often used in configurations with semiconductor switches 18. Hence when reference is made to switch voltage this may also include Vka (for a thyristor), Vds (for a mosfet), Vf (forward voltage for a diode), etc.

In addition to the above switch voltage and switch currents measurements the monitoring unit 4 may also facilitate measurements of temperatures such as baseplate and terminal temperatures of the semiconductor switch, DC link voltage, power module output current, switch current, etc.

Some of the above measurements may alternatively be performed by sensors 17, 21, 23, 24 these sensors may be external to the monitoring unit 4 or implemented as part of the monitoring unit 4.

In an embodiment of the invention the measuring unit 4 may further facilitate the above mentioned measurements including switch voltage, switch current, temperatures, etc. in a switching mode. This preferably includes the transient turn off voltage peak during switching (i.e. in the switching mode).

In an embodiment of the invention the measuring unit 4 further facilitates measuring the above mentioned measurements in a non-conducting mode. It may be advantageous to be able to measure e.g. the switch voltage in off state (non-conducting mode). The off state voltage may give information of high leakage current if measurement of the leakage current is not facilitated by the monitoring unit 4. The transient turnoff voltage may indicate high stress or state of health of semiconductor switch (including diode).

In an embodiment of the invention, the analog measuring circuit includes means such as a semiconductor device for blocking the high voltage across the semiconductor device during the non-conducting mode. This is advantageous in that this facilitates measurements directly on the individual semiconductor switches making it possible to measure e.g. the voltage drop over the semiconductor switch Hence the measuring unit 4 facilitates the above mentioned measurements including $V_{ce}$ when the semiconductor switch is conducting current i.e. measurement in a conducting mode; when the semiconductor switch does not conduct current i.e. voltage measurement in a non-conducting mode and in the time voltage across the semiconductor switch changes state from a conducting mode to a non-conducting mode or vice versa i.e. measurement in a switching mode.

The processing (e.g. including analysis and estimations) of the measurements is performed by a data processor. Either a data processor 11 is part of the monitoring unit 4 or an additional data processor which is part of an external controller 13. Such processing of measurements may result in knowledge of the semiconductor switch junction temperature (of semiconductor switch and diode), temperature of the one or more power modules, estimation of fatigue level and/or end of lifetime of the semiconductor switches and power modules etc.

It should be noted that the monitoring unit 4 facilitates measuring and processing of measured data of the output of power module 15 (i.e. switch current also sometimes referred to as the current through the collector i.e. Ic) without internal power module current sensors 17. This is facilitated by connecting an external current sensor 24 to the monitoring unit 4 e.g. via the communication interface 10.

In the same way the monitoring unit 4 may also be configured for measurements of DC-link voltage (Vdc) either by means of internal converter sensors, sensors of the monitoring unit 4 or external sensors.

Hence a preferred objective with the invention is to measure temperatures, switch voltage and/or switch current and use these measurements e.g. for control, calculating the semiconductor switch/power module junction temperature and real time state of health of the semiconductor switch 18, etc. In case these measurements are performed and transmitted e.g. to an external controller 13 this information enables driving the semiconductor switch 18 closer to its design limit. Alternatively or in combination to the aforesaid, as mentioned, the measurements may be stored and used for post analysis, root cause analyses, statistical analysis, etc.

As converters 2 grow in size the number switches 18 they comprise increase which in itself increase the risk of one of these switches 18 are failing. In addition it gets harder and harder to get access to converter components due to the fact that converter design gets more and more compact but also because today many converters are located in wind turbine at remote locations offshore or onshore. Hence converter downtime due to warnings or alarms from the converter 2 may increase due maintenance or replacement of converter parts do to the physical layout of the converter 2. Therefore preventive initiatives reducing causes to such downtime are appreciable. The measurements described in this document is categorized as such preventive action hence could be referred to as preventive monitoring or condition monitoring of the converter 2.

Hence the present invention may facilitate driving the semiconductor switches 18 closer to design limit of e.g. the temperature or monitor what happens with e.g. temperature when driving the semiconductor switch 18 close to its design limit.

Hence because the measurements are made at the power module 15 and maybe on the switch 18 directly either at the power module 15 or at the gate driver 16 of the switches the measurements are reflecting the real time/in operation mode state of the power module 15 and/or switches hereof. There is an improvement in relation to known systems where such measurements is estimated based on models of the power module 15, surrounding temperature, loads, load time, etc.

At FIG. 1, attached to the converter 1 is a monitoring unit 4 of the invention. The monitoring unit 4 may, when connected to the converter 2, be attached to the converter 2 or panel 1 by fastening means, a rail in the panel 1, fastened by means of the connection means 6 or simply be located on the panel floor. It should be mentioned that it is preferred that at least the hot area 7 of the monitoring unit 4 is located close to the measuring point to limit noise and the like to the measuring result.

In addition to the above-mentioned the panel 1 may also include additional hardware 5 such as external controllers 13, breakers, safety systems, cooling system for the converter, etc.

Figure 2:
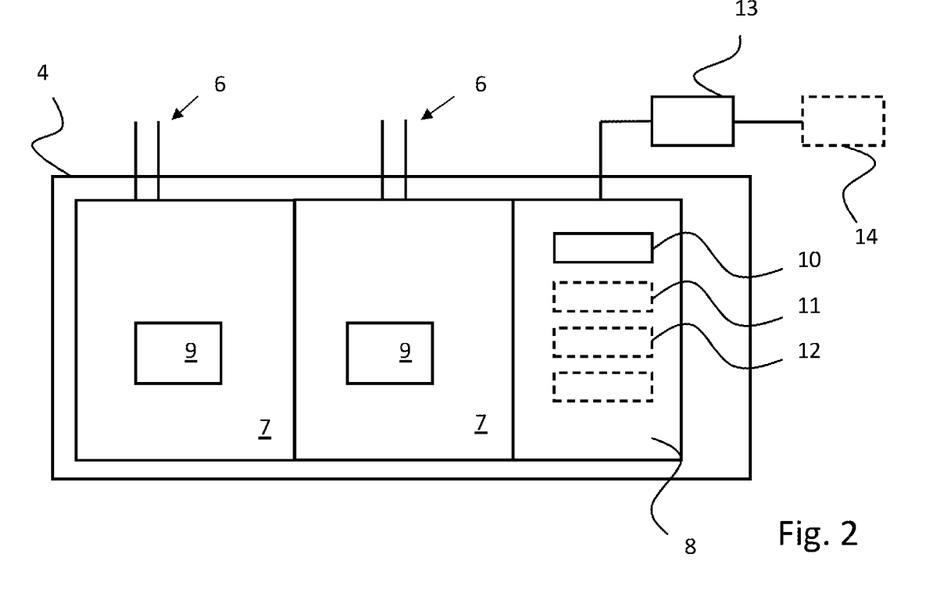
FIG. 2 illustrates monitoring unit connected to an inverter module.

FIG. 2 illustrates a more detailed view of the monitoring unit 4. The monitoring unit 4 preferably comprises a printed circuit board divided into so called hot 7 and cold 8 areas.

The difference between so-called hot 7 and cold 8 areas is that cold areas 8 are safe to touch by hand i.e. protected against electric shock. Hence cold areas 8 typically have the same electric potential as external controllers 13 to which it communicates preferably this common potential is ground. Alternatively areas of a printed circuit board could be characterised as cold if it is protected against electric shock e.g. by complying with requirements to electrical double insulated material, voltages of the area do not exceed ELV (ELV: Extra Low Voltage) or requirements to SELV (SELV: Separated Extra Low Voltage) circuits are complied with or if similar protective arrangements is protecting the area. Such arrangements as well as ELV and SELV definitions may be found in IEC 61140—Protection against electric shock (third edition 2001-10).

In contrary hot areas 7 are not protected against electric shock and preferably self-supplied with electric energy. The energy for use in hot areas 7 may e.g. be facilitated by the collector/emitter voltage ($V_{CE}$) of the semiconductor switch 18 which has to be measure, or by the Vdc. This $V_{CE}$ may be above 1000V in the non-conducting mode of the switch 18 which then could charge e.g. a capacitor which then may serve as power supply to a measuring circuit 9 of one or more hot areas 7. Alternatively the hot areas 7 may be supplied from the cold side 8 by means of magnetic energy transfer including a transformer or power supplies with sufficient insulation class.

The hot 7 and cold 8 areas may be present on the same printed circuit board or on separate printed circuit boards. In the first situation obviously it is preferred that the printed circuit board is in one enclosure while in the latter situation it might be preferred that the hot 7 and cold 8 areas are in separate enclosures. The latter facilitates mounting the hot area enclosure (measuring unit) close to the e.g. the inverter to be monitored while the cold area enclosure (main or data processing unit) might be close to or part of other control components. In this embodiment the cold area enclosure might be less exposed to noise disturbing the data processing and communication.

FIG. 2 illustrates one printed circuited board divided in two hot areas 7 and one cold area 8. If present on the same printed circuit board galvanic separation is mandatory. Therefore communication between hot 7 and cold 8 areas may be carried out by means of optic communication technology, radio communication technology (e.g. wireless), magnetic coupling transformers (i.e. inductive coupling), etc.

It should be mentioned that if the hot and cold areas 7, 8 are on separate printed circuits boards' measurements from the hot area enclosure have to be transmitted to the cold area enclosure 8. To facilitate this data communication the hot area enclosure has to have at least a data communication interface. In case the data communication between the hot and cold area enclosures is optical fiber such data communication interface might at least comprise an electric-to-optic converter also sometimes referred to as an optic transmitter/receiver.

It should be mentioned that in the situation when the hot and cold 7, 8 areas are in one single enclosure (maybe on the same PCB) galvanic separation may be provided by means of an optocoupler, optic fiber, wireless, pulse transformer and the like.

Alternatively one or more of the above mentioned methods of communication facilitating galvanic separation could also be used for data communication between a hot area enclosure and a cold area enclosure.

In addition, from the hot areas 7 electrical connection means 6 extends facilitating electrical connection between the monitoring unit 4 and the one or more converter components such as an inverter 3 to be monitored.

In an embodiment of the invention the connection means 6 is implemented as flexible connection means 6 preferably as wires. This may ease mounting of the monitoring unit 4 to the converter 2 and further it may ease fastening of the monitoring unit 4 to the converter, panel, etc. after mounting.

As an alternative the connection means 6 may be designed to a specific type of converter 2. When this is possible rigid connection means 6 may be preferred in that plug and socket like connection between the monitoring unit 4 and the converter 2 may be facilitated.

In an embodiment of the invention, the electrical connection means 6 may by divided in a first part and a second part. The first part is permanently fixed to the printed circuit board and electric connected to the measuring circuits 9. The second part is removably fixed to the first part and in this way the second part facilitates the interface to the converter 2. This is advantages in that in this way the monitoring unit 4 is universal and only the second part of the electrical connection means 6 has to be changed for the monitoring unit 4 to fit to different converters 2.

It should be mentioned that the electric connection means 6 and the termination hereof is preferably defined by the converter component to which it has to be connected.

Further the monitoring unit 4 comprises at least one cold area 8, the cold area 8 comprises at least a communication interface 10 facilitating communication with external data processors such as servers, computers, handheld devices, controllers, etc. This data communication may be real time as data is acquired or after measurements have been made and data is stored.

In addition the cold area 8 may comprise one or more data processing devices 11 for local processing and evaluation of the measurements obtained from the hot areas.

Further the cold area 8 may comprise one or more data storages 12 for storing raw or processed data. The data storage 12 may be a temporally storage until transmission of data is possible or until the monitoring unit 4 is serviced or taking home to the laboratory where data is transferred from the monitoring unit 4 to an external computer. Hence the data from the monitoring unit 4 may be stored in a data storage 12 of the monitoring unit 4 until it can be transferred either by connecting the monitoring unit 4 to e.g. a laptop or communicated over a data network such as the wind turbine network, wind park network or internet when possible. Data communication may be wireless.

The communication interface 10 may also facilitate communication between the monitoring unit 4 and an external controller 13 such as e.g. converter controller, wind turbine controller, etc. In this way the measurements from the monitoring unit 4 may be used directly in the control of the converter and/or wind turbine and not only for post-analysis.

In case the monitoring unit 4 does not provide current or temperature measurements, the external controller 13 may communicate with an external sensor 14 or the communication interface 10 of the cold area 8 may communicate directly with such external sensor 14. By adding current measurements to the voltage measurements made by the monitoring unit 4 additional information may be derived from the measurements of the monitoring unit 4 including timing and synchronisation issues.

Such additional information may include synchronization of measurement of voltage and current. A data processor e.g. of the monitoring unit 4 may facilitates time synchronization between measurements of the switch voltage and an output current of the power module 15 and/or measurements of the DC-link voltage and output current of the power module 15. The time synchronization is advantageous in that it enables correlation of measurements of e.g. voltage and current facilitating matching of a voltage and a current measurement in the time domain.

The measuring circuit 9 (or the hot area 7 as such) may comprise filters, differential amplifiers etc. for enabling measurements at the power module 15. In addition the measuring circuit 9/hot area 7 may include electronic components necessary for blocking current, dividing voltage, etc. this may be implemented as a semiconductor device for blocking of the high voltage across the IGBT during off state and thereby facilitates measurements directly on the individual semiconductor switches. Hence it becomes possible to measure the voltage drop over the semiconductor switch 18 i.e. switch voltage over the collector and emitter (in case the switch is of the type IGBT) also referred to as Vce as well as various currents including switch currents. Hence the measuring circuit 9 facilitating measuring in the conducting mode, non-conducting mode and switching mode.

The measuring circuit 9 is preferably capable of running a self-calibration routine. An example of such self-calibration routine could be based on the assumption that after a time of no current conduction of a power module 15, the temperature of the switch is the same as the temperature of the baseplate or heatsink. The heatsink is used to remove heat from the switches 18. Heatsing may at least partly be implemented as cooling fins (primly air cooling), baseplate may be in thermal contact with a heatsink (primly fluid cooling), etc. Knowing this temperature and the size of a current applied to the power module 15 a reference voltage $V_{CE}$ can be measured.

Hence the self-calibrating routine may is based on that after a period of time with no current running through the switch 18 (in non-conducting mode), then when current starts flowing through the switch 18 again (in conducting mode) the temperature of the switch is known. Hence at this known temperature it is possible to generate a reference point or a set of reference points.

Of course the temperature starts to increase the moment the switch 18 starts to conduct current. Therefore it is very hard to obtain a series of reference measurements at the same temperature. Hence for the purpose of this invention the temperature may be defined as no longer stabile when it has changed a few degrees such as between 1 and 5 degrees Celsius from the so-called stand still temperature. Typically the temperature will be considered as substantial constant when the converter is inactive also referred to as in off-state or non-conducting mode.

The number of reference measurements which is possible to obtain at such substantial constant temperature depends as mentioned on the current conducted by the switch 18. High current leads to rapid increase of temperature and thereby it is not possible to obtain as many reference measurements as if the current is not high. An example of high current could e.g. be 10% of power module rating, hence in case the rated power of a power module 15 is 1000 A a high current would be around 100 A according to this example.

By making a (reference) set of e.g. 4 or 5 reference measurements (comprising e.g. a measurement of Vce and current at the substantial constant temperature) and repeating this in maybe 4 or 5 converter off-state periods knowledge of the individual switch 18 is obtained. Due to the linearity of voltage, current and temperature dependencies of switches 18 it then becomes then possible to estimate a reference set without of measuring it/at high temperature. This information could be used to derive state (such as end of lifetime, deterioration, etc.) of the switch, load of the switch, etc.

Regarding the linearity mentioned above it may have to be based on that some material specific known mechanisms of the switch 18 which makes it possible to extrapolate. Such relationships may have to be established in controlled laboratory tests on one or more reference switch 18/power modules 15 depending of type of switch 18.

The time of non-switching depends on physical and thermic design of the power module 15 and converter 2 as such. Time between one second and half an hour would be sufficient in most cases to obtain a common temperature of the power module 15. This temperature could then be measured e.g. at the baseplate of the semiconductor switch 18 construction.

Obtaining a reference voltage as describe is continued over a period of e.g. one month (a period of time in which it is assumed that the switch characteristics is not changed due to wear and the like) and in this way a reference curve of the individual switch characteristics at different temperatures and currents are obtained. If then in a year or two from obtaining this reference curve the switch 18 deviate from the reference curve such deviation may indicate that the switch 18 may soon fail or at least in risk of failing.

The embodiment illustrated and described according to FIG. 2 preferably comprises a hot area 7 having at least a measuring circuit 9, an operational amplifier (amplifying the measurements), an analog to digital converter and a communication interface 10 as described above. However in other embodiments the hot area 7 may only comprise the measuring circuit 9 and a high impedance of e.g. above 1M ohm facilitating galvanic separation between the hot and cold areas 7, 8. The operational amplifier and the analog to digital converter may then be part of the cold area 8.

In yet another embodiment the hot area may also facilitate calculations and data processing by means of data processors located in the hot area or in the hot areas enclosure.

It should be mentioned that one or more hot areas may share measuring units 9 and other electronics even though it is preferred that the each hot area 7 comprise its own sets of electronics.

Further it should be mentioned, that a plurality of hot areas (hot area may also be referred to as measuring units) may communicate with one and the same cold area (cold area may also be referred to as a main unit or processing unit).

Figure 3:
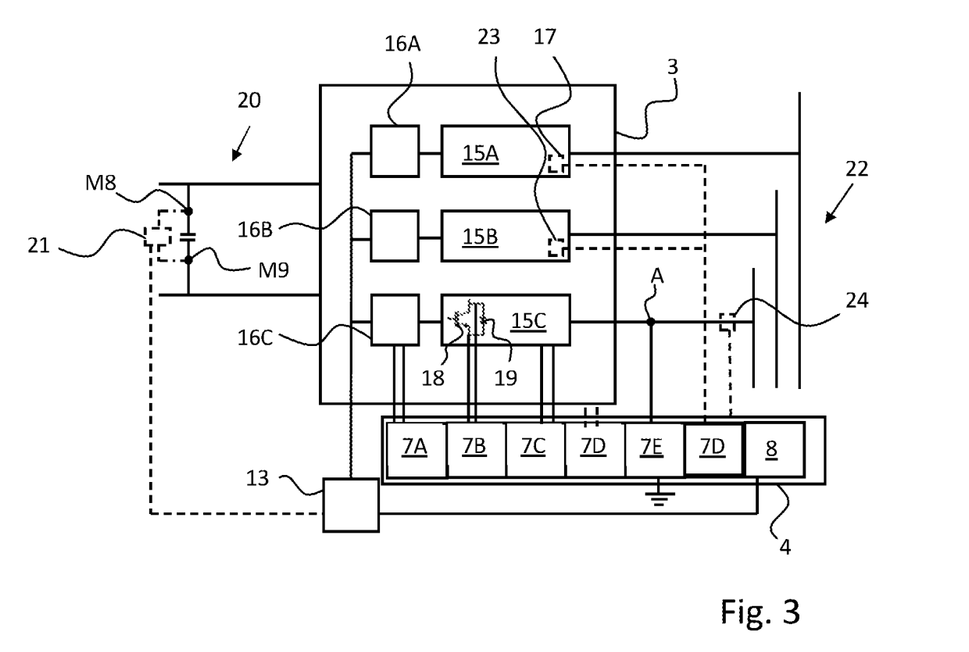
FIG. 3 illustrates a detailed view of an inverter and FIG. 4 illustrates a detailed view of a power module.

FIG. 3 illustrates a grid side inverter 3 of a converter 2 comprising three power modules 15A-C each including a plurality of semiconductor switches 18. The converter 2 also includes a generator side inverter (not illustrated) connected to the grid side inverter by means of a DC link 20. The grid side and generator side inverter may be identical and current may flow both ways through the converter.

The switches 18 are controlled e.g. by the converter controller 13 via gate drivers 16A-C. To be able to control the switch 18 the gate terminal hereof is feed to the gate drive 16 and sometimes also the collector and emitter terminals of the switch 18 may be feed to the gate driver 16 (this depends on converter design). The output of the power modules 15 is via an output terminal denoted measuring point A at FIG. 3 feed to the utility grid 22.

FIG. 3 further illustrates a monitoring unit 4 according to the invention. The hot areas 7A-E is connected to different electric converter components of which relevant measurements could be achieved. As illustrated by the hot area 7D and sensor 24 measurements of e.g. current and voltage may also be made at the output (preferably output terminal(s)) of the inverter 3.

In addition FIG. 3 illustrates external current 17, voltage 21 and temperature 23 sensors measuring at electric converter components and preferably connected to the cold area 8 of the monitoring unit 4. Hence FIG. 3 should not be limiting the scope of protection rather it should illustrate examples of the variety of different setups of the monitoring unit 4 including internal and external measuring units/sensors and different locations of the converter 2 to measure different values.

Sensors such as the current sensor 17 may be part of the power module 15 from birth or may be mounted at the power module 15 when the monitoring unit 4 is connected to the power module. The current sensor 17 may e.g. be implemented as a Rogcowsky coil. The output of such current sensor 17 may e.g. be available to the monitoring unit 4 at the gate driver 16 or via separate electric connection from the current sensor 17 to the monitoring unit 4.

Figure 4:
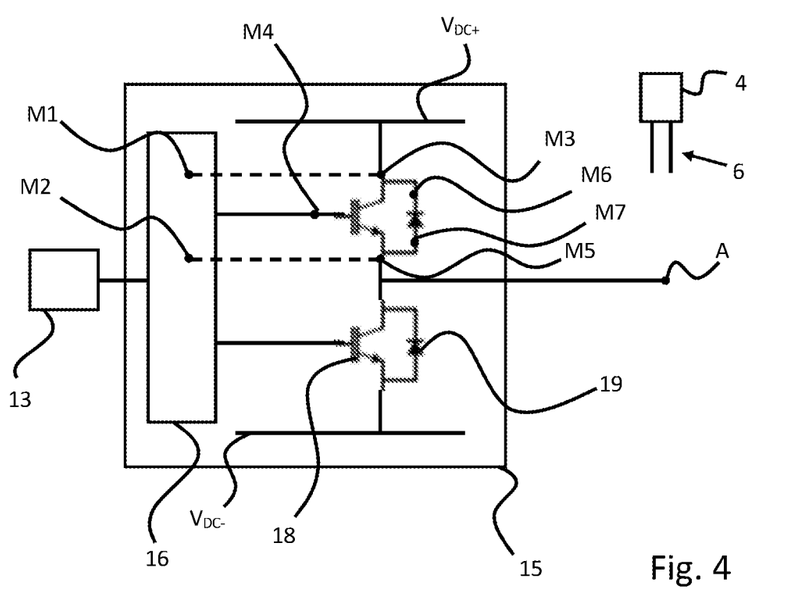

FIG. 4 illustrates a power module 15 of an inverter 3 according to an embodiment of the invention. The power module 15 of FIG. 4 comprises two semiconductor switches 18 in a parallel configuration with two diodes 19 which in an embodiment could be e.g. of the IGBT type. The voltage over the sum of these two IGBTs may be referred to as DC link voltage i.e. voltage between $V_{DC+}$ and $V_{DC-}$. It should be mentioned that not illustrated capacitance is also preferably located between $V_{DC+}$ and $V_{DC-}$ and therefore DC link voltage may also refer to voltage over such capacitor.

The output of the semiconductor switches 18 is referred to as phase current or power module output and can be measured at measure point A which may be an output terminal of the power module 15. The illustrated phase current may be the contribution of one phase in a three phase inverter 3/converter 2 system.

The semiconductor switch 18 is controlled from a gate drive 16. The gate drive 16 receives at least references for switching pattern from an external controller 13 such as power stack controller, converter controller, wind turbine controller, etc.

Further FIG. 4 illustrates a monitoring unit 4 according to an embodiment of the invention having connection means 6 for connecting the monitoring unit 4 to measuring points M1-M7 and A.

Measuring points M1 and M2 are switch terminals feed to the gate drive 16 hence the same measurements can be obtained at measuring points M3 and M5. Measuring points M1 and M2 are not always present at the gate drive 16, this depends on the converter 2/inverter 3 design.

Measuring points M6 and M7 are used if measuring of diode is relevant and measuring point M4 is used if gate voltage or current of the semiconductor switch 18 is relevant.

It should be noted that the two illustrated switches 18 preferably are identical having the same measuring points. Further, the measuring unit 4 may also be connected to not illustrated measuring points for measuring variables such as semiconductor switch baseplate temperature and others.

Preferably when monitoring switch voltages the connection means 6 are connected to measuring point A (and a reference such as e.g. $V_{DC-}$ or $V_{DC+}$) see references M1 and M2 (at least in some configurations the potential at M2 is equal to potential in point A) of FIG. 4.

Preferably when monitoring switch current distinguish is made between when the switch is in a conducting mode and in the switching mode (i.e. transition between conduction mode and non-conduction mode). In conducting mode it is assumed that only one of the four switching components of FIG. 4 (i.e. the two switches denoted 18 and the two diodes denoted 19) is carrying the entire current measured in point A. If current measurement is required in the switching mode it preferred that current is measured directly through the switches 18 or diodes 19 of FIG. 4. Hence it is assumed that the upper switch 18 and upper diode 19 is one component as well as the lower switch 18 and lower diode 19 is one component.

Alternatively the connection means 6 may be connected to the gate drive 16, terminals of switch 18, diode 19, etc. It should be mentioned, that it is desired to keep the monitoring unit galvanic separated from the other electrical systems especial ground potential. This is due to the varying potential in the inverter 3 depending on if switches are in conducting or non-conducting mode and is one reason why it is preferred that the monitoring unit is self-supplied with power.

It should be mentioned that the measurements obtained from the measuring unit 4 may be used in control of the converter 2 or the wind turbine. Even though not intended, the measuring unit 4 may participate in this control.

LIST

1. Panel
2. Power converter
3. Inverter
4. Monitoring unit
5. Additional hardware
6. Electric connection means
7. Hot area (7A-7E)
8. Cold area
9. Measuring circuit
10. Communication interface
11. Data processor
12. Data storage
13. External controller
14. External sensor
15. Power module (15A, 15B, 15C)
16. Gate driver (16A, 16B, 16C)
17. Internal current sensor
18. Semiconductor switch
19. Diode
20. DC link
21. External voltage sensor
22. Utility grid
23. Internal temperature sensor
24. External current sensor
A, M1-M7. Measuring points

The invention claimed is:

1. A converter monitoring unit configured for monitoring a voltage over one of at least two semiconductor switches connected in series in a power converter, the converter monitoring unit comprising:
a first area having a first electric potential and comprises a data communication interface,
wherein the data communication interface of the first area is connected to a controller external to the converter monitoring unit, and
wherein the first electric potential is fixed,
a second area having a second electric potential and connected to a first electric connector, the first electric connector is connected to a first measuring point, and to a second electric connector, independent from the first electric connector, the second electric connector is connected to a second measuring point,
wherein the first measuring point is established between a positive DC link voltage (Vdc+) and a first of the at least two series connected semiconductor switches or between a negative DC link voltage (Vdc−) and a second of the at least two series connected semiconductor switch,
wherein the second measuring point is established in the series-connection between the first and the second semiconductor switches,
wherein the at least two series-connected switches are connected by a power converter controller external to the converter monitoring unit, and
wherein the second electric potential changes when a mode of operation of at least one of the series connected semiconductor switches change,
wherein, when connected to the first and to the second measuring points, the converter monitoring unit facilitates measuring a switch voltage of the one of the at least two series-connected semiconductor switches, located between the first and second measuring points.

2. The system according to claim 1, wherein the first electric potential is common with an electric potential of an external data processor.

3. The system according to claim 1, wherein the first electric potential is a ground potential.

4. The system according to claim 1, wherein the second electric potential is high enough to cause electric shock, and the first area and the second area are galvanically isolated to protect the first area from the electric shock.

5. The system according to claim 1, wherein the second area further comprises a measuring circuit configured to measure the voltage between the first measuring point and the second measuring point.

6. The monitoring unit of claim 1, wherein the first area is safe to touch by hand and, at least part of the time when electrically connected to the first measuring point or the second measuring point, the second area is not safe to touch by hand.

7. The monitoring unit of claim 1, wherein a potential difference between the first measuring point and the second measuring point is a potential difference over a single electric converter component of the power converter.

8. The monitoring unit of claim 1, wherein the first and second electric connectors are directly connected between the second area and the first measuring point, and between the second area and the second measuring point.

9. The monitoring unit of claim 1, wherein the at least two series connected semiconductor switches are controlled by the power converter controller based at least partly on measurements obtained by the converter monitoring unit.

10. The monitoring unit of claim 1, wherein the power converter controller is the converter controller.

11. The monitoring unit of claim 1, wherein the first electric potential is the same as the electric potential of the power converter controller when an electric connection therebetween is established.

12. A method of monitoring a voltage over one of at least two semiconductor switches connected in series in a power converter, the method comprising the steps of:
ensuring that the power converter is in a non-conducting mode,
thereafter, connecting a first electric connector of a second area of the monitoring unit to a first measuring point of the power converter and connecting a second electric connector to a second measuring point of the power converter, thereafter, enabling the power converter to be in a conducting mode, and thereafter:
performing, in the second area, a voltage measurement between the first measuring point and the second measuring point while the electric component is conducting a current, wherein the first measuring point is established between a positive DC link voltage ($V_{DC+}$) and a first of the at least two series-connected semiconductor switches or between a negative DC link voltage ($V_{DC-}$) and a second of the at least two series-connected semiconductor switch, and wherein the second measuring point is established in the series-connection between the first and the second semiconductor switches,
the at least two series-connected switches are controlled by a power converter controller external to a converter monitoring unit, and
communicating, via a data communication interface of the first area of the converter monitoring unit, data or processed data related to the voltage measurement to a data processor external to the monitoring unit, wherein an electric potential of the first area is fixed and an electric potential of the second area changes as an electric potential of at least one of the first measuring point and second measuring point changes.

13. The method of claim 12, wherein the mode of operation of the power converter is controlled by a converter controller.

14. The monitoring unit of claim 12, wherein the first area is safe to touch by hand and, at least part of the time when electrically connected to the first measuring point or the second measuring point, the second area is not safe to touch by hand.

15. The monitoring unit of claim 12, wherein a potential difference between the first measuring point and the second measuring point is a potential difference over a single electric converter component of the power converter.

16. The monitoring unit of claim 12, wherein the first and second electric connectors are directly connected between the second area and the first measuring point, and between the second area and the second measuring point.

17. A converter monitoring unit used in monitoring a voltage over one of at least two semiconductor switches connected in series in a power converter, the monitoring unit comprising:
a first area having a first electric potential and comprising a data communication interface; and
a second area having a second electric potential and comprising at least a first and a second electric connectors,
wherein the voltage being monitored between a first measuring point and a second measuring point of the power converter,
wherein the first measuring point is established between a positive DC link voltage ($V_{DC+}$) and a first of the at least two series-connected semiconductor switches or between a negative DC link voltage ($V_{DC-}$) and a second of the at least two series-connected semiconductor switch, and wherein the second measuring point is established in the series-connection between the first and the second semiconductor switches,
wherein the at least two series-connected switches are controlled by a power converter controller external to the converter monitoring unit,
wherein the first electric potential is fixed and is different from the second electric potential,
wherein the second electric potential changes as an electric potential of at least one of the first measuring point and the second measuring point changes,
wherein the data communication interface is configured to facilitate data communication between the first area and an external data processor, and
wherein the first and second electric connectors are configured to facilitate an electric connection between the second area and the first measuring point, and between the second area and the second measuring point.

18. The monitoring unit of claim 17, wherein the monitoring unit is temporarily connected to the power converter.

19. The monitoring unit of claim 17, wherein the second electric potential is high enough to cause electric shock, and the first area and the second area are galvanically isolated to protect the first area from the electric shock.

20. The monitoring unit of claim 19, wherein the galvanic isolation is facilitated by an impedance of at least 1 Mega Ohm between the first area and the second area.

21. The monitoring unit of claim 17, wherein the first area and the second area are located in a common enclosure.

22. The monitoring unit of claim 17, wherein the second area of the monitoring unit is self-supplied with power from the measuring points of the power converter.

23. The monitoring unit of claim 17, wherein the second area further comprises a measuring circuit configured to measure the voltage between the first measuring point and the second measuring point.

24. The monitoring unit of claim 17, wherein the at least first and second electric connectors are further configured to facilitate an electric connection between the monitoring unit and output power terminals of an inverter of the power converter.

25. The monitoring unit of claim 17, wherein the monitored voltage is indicative of a state of health of the power converter, an operation condition of the power converter, parameters of the power converter, optimization control of the power converter, and timing of the power converter.

26. The monitoring unit of claim 17, wherein the monitoring unit is configured for remote configuration including defining a batch job, wherein the batch job comprises predefined trigger criteria and predefined data to be acquired when the predefined trigger criteria is complied with.

27. The monitoring unit of claim 17, wherein the monitoring unit is configured for remote configuration, wherein the monitoring unit is physically attached to the power converter with a fastener.

28. The monitoring unit of claim 17, wherein the first area is safe to touch by hand and, at least part of the time when electrically connected to the first measuring point or the second measuring point, the second area is not safe to touch by hand.

29. The monitoring unit of claim 17, wherein a potential difference between the first measuring point and the second measuring point is a potential difference over a single electric converter component of the power converter.

30. The monitoring unit of claim 17, wherein the at least first and second electric connectors are directly connected between the second area and the first measuring point, and between the second area and the second measuring point.

* * * * *